United States Patent
Suzuki et al.

(10) Patent No.: US 6,888,774 B2
(45) Date of Patent: May 3, 2005

(54) SEMICONDUCTOR MEMORY DEVICE AND ITS TESTING METHOD

(75) Inventors: Takanobu Suzuki, Tokyo (JP); Tamaki Tsuruda, Tokyo (JP); Katsushige Hayashi, Tokyo (JP)

(73) Assignees: Renesas Technology Corp., Tokyo (JP); Mitsubishi Electric Engineering Company Limited, Tokyo (JP)

( * ) Notice: Subject to any disclaimer, the term of this patent is extended or adjusted under 35 U.S.C. 154(b) by 373 days.

(21) Appl. No.: 10/224,499

(22) Filed: Aug. 21, 2002

(65) Prior Publication Data

US 2003/0058730 A1 Mar. 27, 2003

(30) Foreign Application Priority Data

Sep. 25, 2001 (JP) ........................................ 2001-291653

(51) Int. Cl.[7] ................................................. G11C 8/00
(52) U.S. Cl. .................. 365/230.03; 365/201; 365/194; 365/206
(58) Field of Search ........................... 365/230.03, 201, 365/206, 194

(56) References Cited

U.S. PATENT DOCUMENTS 4,821,232 A * 4/1989 Nakano et al. ......... 365/187.09
5,917,758 A * 6/1999 Keeth ..................... 365/189.05

* cited by examiner

Primary Examiner—Tan T. Nguyen
(74) Attorney, Agent, or Firm—McDermott Will & Emery LLP (57) ABSTRACT

A semiconductor memory device is of a bank switching type having a plurality of memory array banks provided in a memory chip which can be switched from one to another for storage operation. The semiconductor memory device includes: a plurality of memory arrays in the memory array banks; an input/output circuit for transmitting information data between the memory arrays and the outside; a data bus for connecting between the memory arrays and the input/output circuit; and N-channel transistors provided across the data bus. The data bus consists of a plurality of adjacent lines. Each of N-channel transistors is connected at their drain to the corresponding lines of the data bus while at their source to the ground. When a multi-bit test is commenced for writing and reading data on the memory arrays, the N-channel transistors are turned on to connect the lines of the data bus to the ground.

5 Claims, 12 Drawing Sheets

SEMICONDUCTOR MEMORY DEVICE AND ITS TESTING METHOD

BACKGROUND OF THE INVENTION

1. Field of the Invention

The present invention relates to a semiconductor memory device having a plurality of memory cell arrays, e.g., in the form of DRAMs in a memory chip, and a method of testing the semiconductor memory device.

2. Description of the Related Art

In recent years, as highly integral circuit technologies have been introduced in the semiconductor industries, the cost per bit of memories is significantly decreased. However, the increasing demand for memory device now requires an advanced technology for more reduction of the cost. It is however known that as advanced memories for mass storage are developed, their testing process now claims a considerable length of time. This may inhibit the cost reduction, hence hardly permitting more decrease in the cost per bit of memories.

For overcoming the foregoing drawback, some methods are proposed of reducing the time required for testing a semiconductor memory device of bank switching type where a plurality of memory array banks are mounted in a memory chip, and switched from one to another for storage operation. As one of such methods, a multi-bit test is well known, which is a sort of multi-bit parallel test method, for writing one identical data onto a number of bits at once and examining the data read from their corresponding bits for matching or mismatching. In a normal operation mode of the semiconductor memory device, one-bit data received from a DQ pad is written onto and read from each memory cell. In a multi-bit test mode of the semiconductor memory device, one-bit data received from the DQ pad are written onto and read from a plurality of memory cells at once before returned back to the DQ pad.

Figure 10:
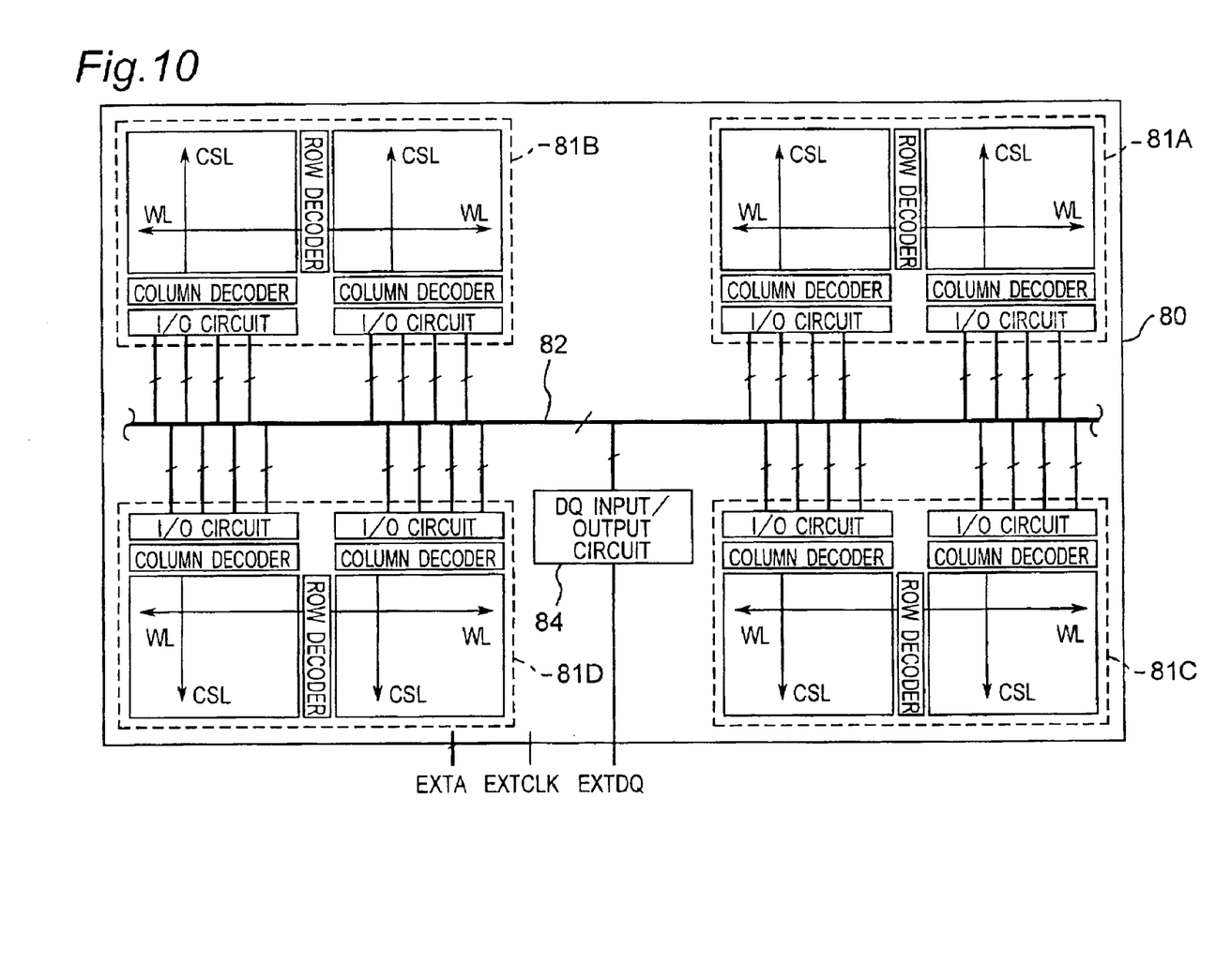
FIG. 10 is a diagram of an overall arrangement of a conventional semiconductor memory device.

The write/read operation in both the normal mode and the multi-bit test mode of the conventional semiconductor memory device of a bank switching type will now be explained referring to FIGS. 10 to 13. FIG. 10 is a block diagram schematically showing the conventional semiconductor memory device of a bank switching type. The semiconductor memory device denoted by 80 includes four memory array banks 81A to 81D provided in a memory chip. Each of the memory array banks 81A to 81D has a plurality of memory arrays (only two shown in FIG. 10). Each memory array is connected by a data bus 82 to a DQ input/output circuit 84.

An information data EXTDQ received from the outside is passed through the DQ input/output circuit 84, sent to the memory array in the memory array bank addressed by an address data EXTA received together with the information data EXTDQ via the data bus 82, and written onto a corresponding memory cell. The information data in the memory cell is read out in response to the input of reading command for the memory cell, sent to the DQ input/output circuit 84 via the data bus 82, and output to the outside.

Figure 11:
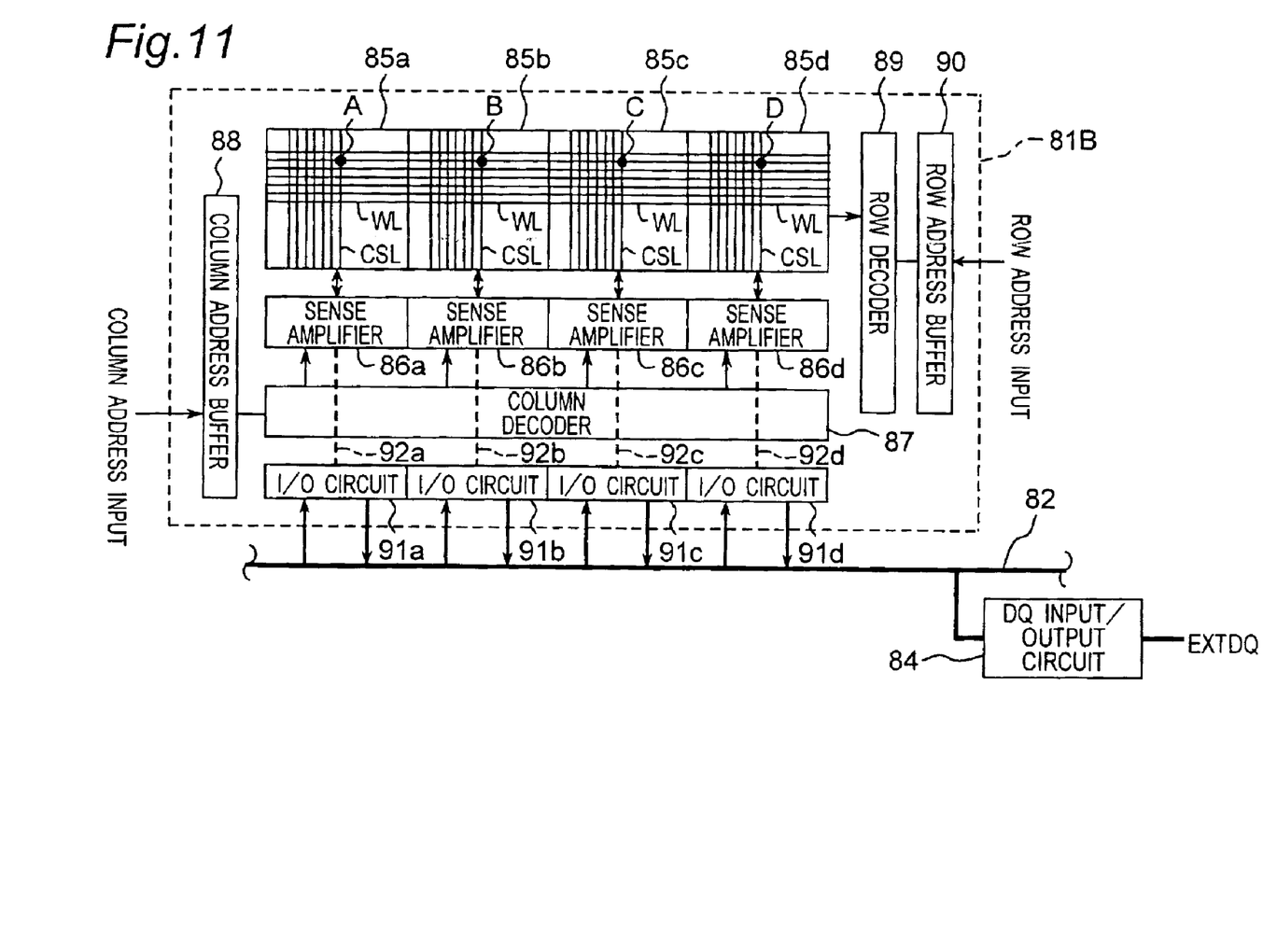
FIG. 11 is a diagram showing a part of a memory array bank provided in the conventional semiconductor memory device.

FIG. 11 illustrates a detail of the memory array bank 81B. The memory array banks 81A, 81C, and 81D are identical in the structure to the memory array bank 81B. The memory array bank 81B includes four memory arrays 85a to 85d, four sense amplifiers 86a to 86d connected to the corresponding memory arrays 85a to 85d, and four I/O circuits 91a to 91d, as the transmission paths of information data. Also, the memory array bank 81B has a column decoder 87, a column address buffer 88 connected to the column decoder 87, a row decoder 89, and a row address buffer 90 connected to the row decoder 89, as the transmission path of address data. The sense amplifiers 86a to 86d are connected by sub data buses 92a to 92d to the I/O circuits 91a to 91d respectively.

In the memory array bank 81B, on the occasion of data writing in a normal mode, a one-bit information data received at the input (not shown) of the DQ input/output circuit 84 is sent via the data bus 82 and written onto a memory cell at the intersection between a row address and a column address in the memory array determined by the address data. For example, in the memory array 85a, the information data received via the DQ input/output circuit 84 is written onto the memory cell (denoted by "A") assigned at the intersection between a word-line (denoted by "WL") selected by the row decoder 89 and a column-select-line (denoted by "CSL") selected by the column decoder 87.

On the occasion of data writing in the multi-bit test mode, the information data received via the DQ input/output circuit 84 is written simultaneously onto four memory cells (denoted by "A" to "D") assigned at the intersection between a word-line and a column-select-line, for same row and column address, in memory arrays 85a to 85d.

On the occasion of data reading in the normal mode, the data are read out from the memory cells assigned at the intersection between a word-line selected by the row decoder 89 and a column-select-line selected by the column decoder 87 in memory arrays 85a to 85d. The data are transmitted via the sense amplifiers 86a to 86d, the sub data buses 92a to 92d, the I/O circuits 91a to 91d, the data bus 82, and the DQ input/output circuit 84 and output to the outside.

On the occasion of data reading in the multi-bit test mode, the data are read out from the memory cells A, B, C, and D shown in FIG. 11 by energizing the four column-select-lines at once similar to the writing operation, passed via the sense amplifiers 86a to 86d, the sub data buses 92a to 92d, and I/O circuits 91a to 91d, and loaded to the data bus 82.

Figure 12:
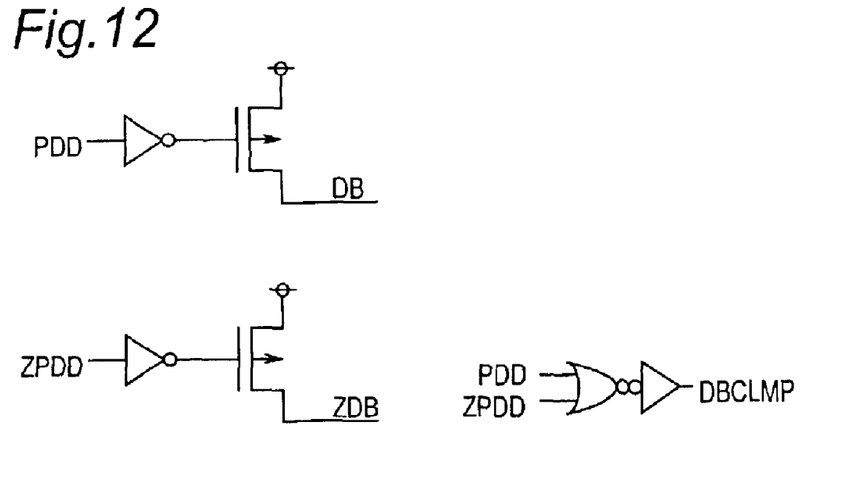
FIG. 12 is a diagram of a DB drive circuit provided in an I/O circuit of the memory array bank in the conventional semiconductor memory device.

As the data bus 82 basically includes a pair of lines DB (data bus) and ZDB, its paired lines are provided on a layout pattern depending on the type of the memory device. For example, when the memory device is of x16 type, the data bus 82 has sixteen pairs of lines. When x8 type, the data bus 82 has eight pairs of lines. While the data bus 82 is patterned in such manner, each of the I/O circuits 91 to 91d includes a data bus drive circuit 93 (referred to as a DB drive circuit hereinafter) for DB-ZDB lines as best shown in FIG. 12. When receiving a H level signal from the memory cell, the DB drive circuit 93 provides an "H" drive on the DB line and an "Hi-Z" (high impedance) drive on the ZDB line. On the other hand, when receiving an L level signal from the memory cell, the DB drive circuit 93 provides an "Hi-Z" drive on the DB line and an "H" drive on the ZDB line.

The data bus 82 performs a wired-or action on each data from the four memory cells and its wired-or signal is transmitted to the DQ input/output circuit 84. On the occasion of data writing, the same data is simultaneously written on four memory cells. Accordingly, when non of the four memory cells is defective, the four data read out from their respective memory cells are identical thus providing the H level on either the DB or ZDB line. When the read-out data is an H level signal, the DB line draws "H" and the ZDB line draws "L(Hi-Z)". When the read-out data is an L level signal, the DB line draws "L(Hi-Z)" and the ZDB line draws "H".

If any of the four memory cells is defective, the read-out data include both H and L levels hence causing both the lines DB and ZDB to draw "H". When any of the four memory cells is defective and the read-out data include both H and L levels, the "H" level on both the lines DB and ZDB is received by the DQ input/output circuit 84.

Figure 13:
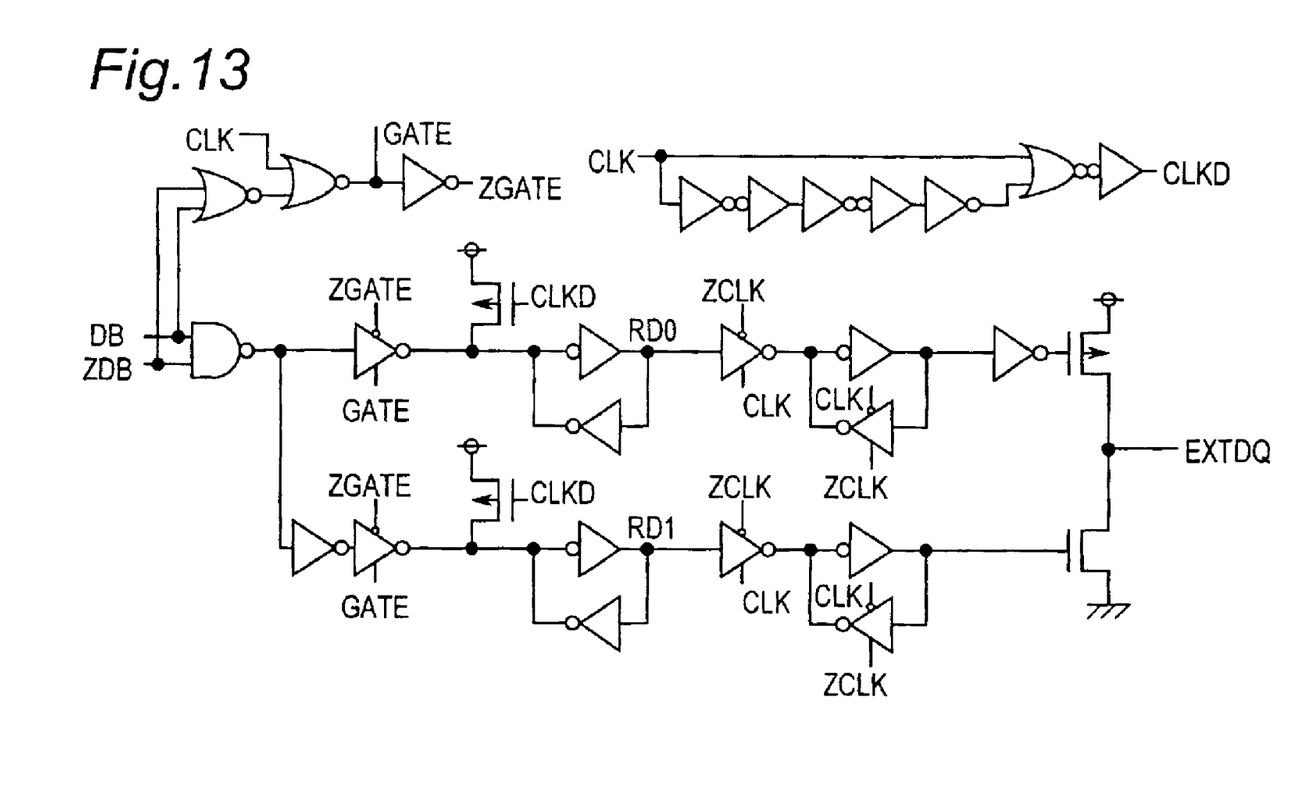
FIG. 13 is a diagram of the output side of a DQ input/output circuit provided in the conventional semiconductor memory device.
Figure 14:
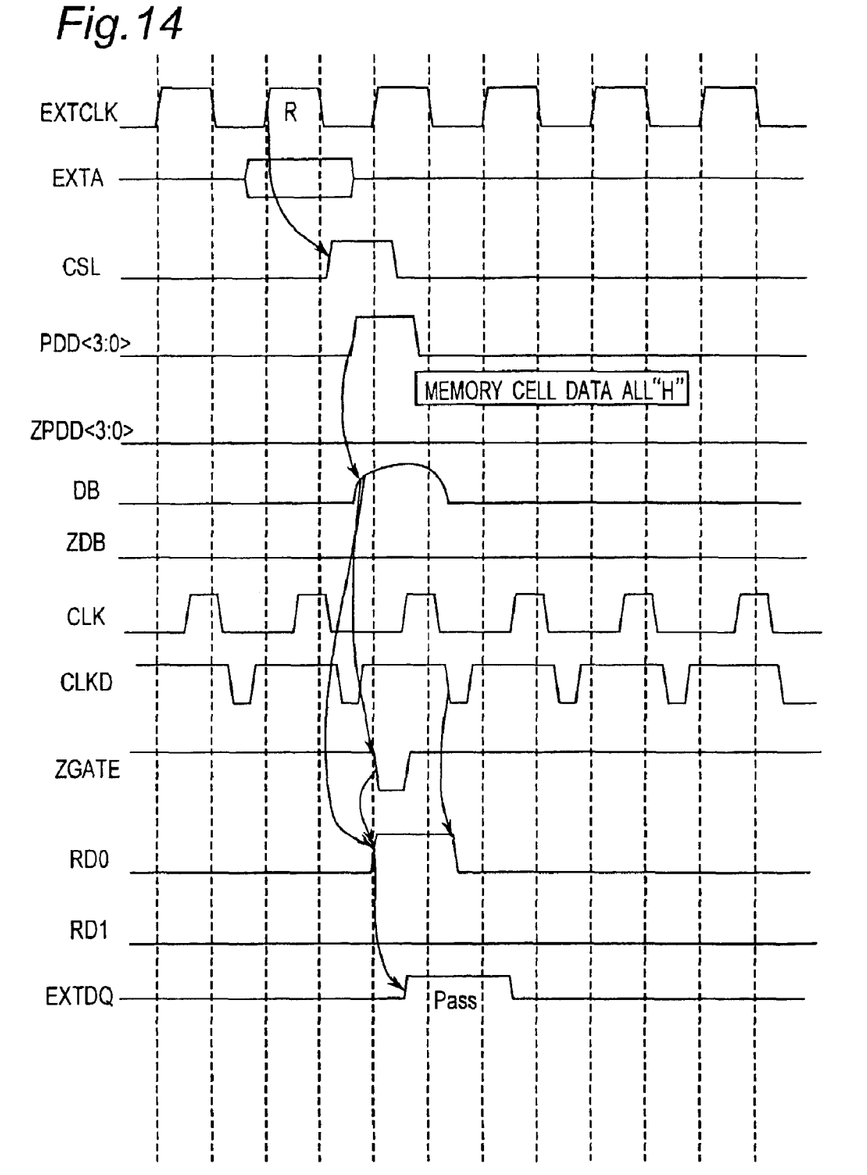
FIG. 14 is a timing chart of signals when the multi-bit test mode provides "passed"
Figure 15:
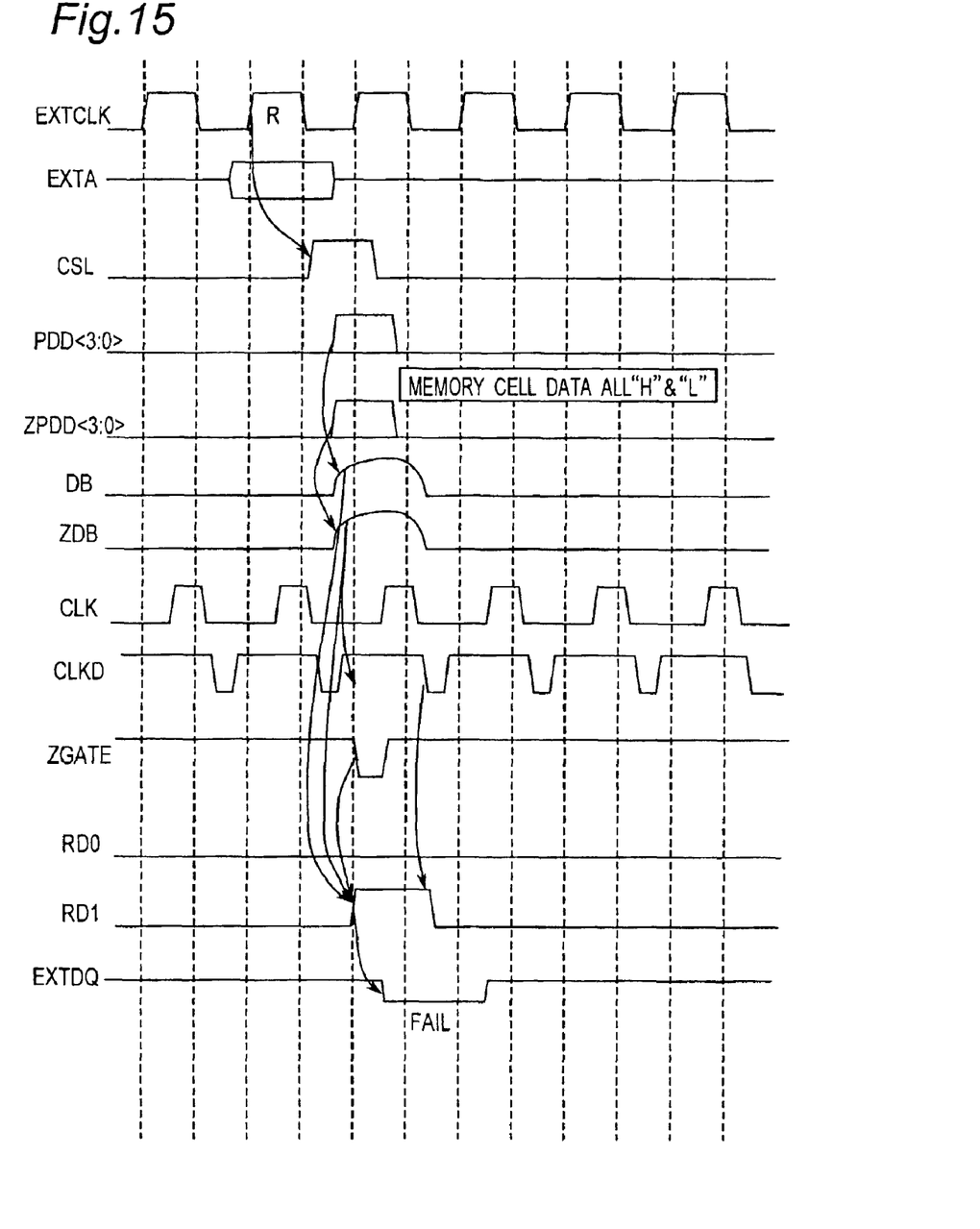
FIG. 15 is a timing chart of the signals when the multi-bit test mode provides "failed"

Upon receiving a result from the four memory cell data, the DQ input/output circuit 84 performs a pass/fail operation. More specifically as shown in FIG. 13, the DQ input/output circuit 84 has a logic that it judges "passed" when the DB line and the ZDB line draw "H" and "L", or "L" and "H" respectively and "failed" when both the DB and ZDB lines draw "H". FIGS. 14 and 15 are timing charts of the signals when the multi-bit test mode provides "passed" and "failed" respectively. The symbols (e.g. EXTCLK, EXTA, and EXTDQ) shown in FIGS. 14 and 15 represent the signals announced in the output side of the DQ input/output circuit 84 shown in FIG. 13.

As described above, the multi-bit test allows the multiple memory cells in different memory arrays to be tested at once thus contributing to the reduction of the time required for testing the semiconductor memory device 80.

Figure 16:
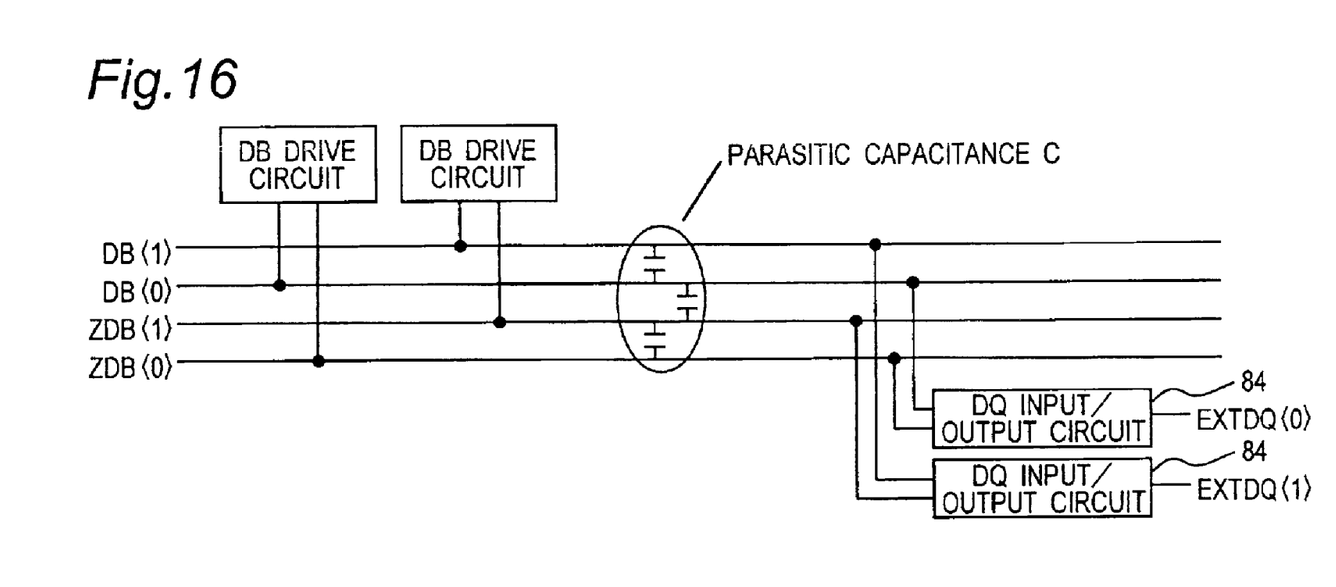
FIG. 16 is a schematic diagram showing a parasitic capacitance C produced between any adjacent lines of the data bus.

However, the paired lines DB and ZDB of the data bus 82 are located adjacent to each other in a layout pattern. As the memory cells are improved in the down-sizing and the integral level, the generation of a parasitic capacitance C between the paired lines may hardly be negligible (See FIG. 16). When any paired lines adjacent to each other of lines in the data bus 82 are energized in the multi-bit test mode, their induced parasitic capacitance C may produce a coupling noise which elevates the level of the data bus 82 on "L(Hi-Z)" side. As a result, its level is detected as "H" level and may interrupt the pass/fail operation of the DQ input/output circuit 84 thus leading to a fault decision.

SUMMARY OF THE INVENTION

It is an object to provide a semiconductor memory device which can eliminate any fault result of a multi-bit test resulting from the coupling noises produced between two adjacent lines of a data bus and a method of testing the semiconductor memory device.

A semiconductor memory device of the present invention is of a bank switching type having a plurality of memory array banks provided in a memory chip which can be switched from one to another for storage operation. The semiconductor memory device basically includes: a plurality of memory arrays incorporated in the memory array banks; an input/output circuit for transmitting information data between the memory arrays and the outside; a data bus for connecting between the memory arrays and the input/output circuit; and N-channel transistors provided across the data bus. The data bus consists of a plurality of adjacent lines. Each of N-channel transistors is connected at their drain to the corresponding lines of the data bus while at their source to the ground. In the semiconductor memory, when a multi-bit test is commenced for writing and reading data on the memory arrays, the N-channel transistors are turned on to connect the lines of the data bus to the ground.

Accordingly, the "L(Hi-Z)" level on the lines which may undesirably be elevated by the effect of coupling noises resulting from the parasitic capacitance C induced between any two adjacent lines of the data bus, can be maintained to a low level enough not to be recognized as the "H" level. As a result, any fault judgment of the multi-bit test caused by the effect of coupling noises generated between the lines of the data bus can successfully be eliminated.

A set of the N-channel transistors are connected in parallel to each other across each line of the data bus, a switch is provided at the drain of each the N-channel transistor for connecting and disconnecting the line and the source.

A set of the N-channel transistors are connected in parallel to each other across each line of the data bus, a fuse is provided at the drain of each the N-channel transistor for disconnecting the line when receiving an over-current.

The semiconductor memory device further includes a delay circuit for delaying by a predetermined length of time the input of a signal to the gate of the N-channel transistor from the start of driving the data via the lines of the data bus.

The semiconductor memory device still further includes a delay circuit for delaying by a predetermined length of time the input of a signal to the gate of the N-channel transistor when the output side of the input/output circuit on the lines has reached to a CMOS level.

DETAILED DESCRIPTION OF THE INVENTION

Some embodiments of the present invention will be described in more detail referring to the accompanying drawings.

First Embodiment

Figure 1:
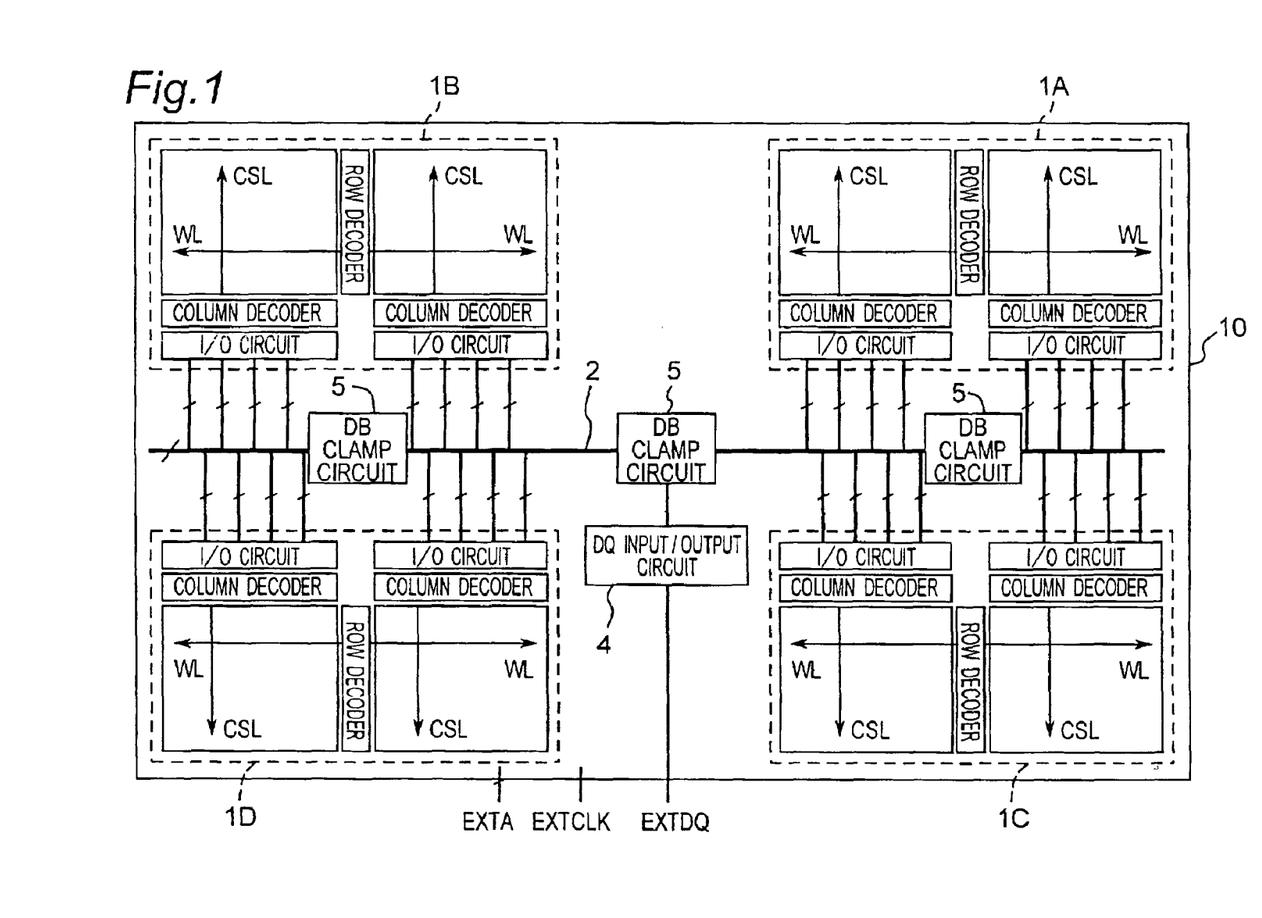
FIG. 1 is a diagram of an overall arrangement of a semiconductor memory device according to first embodiment of the present invention.

FIG. 1 illustrates an overall arrangement of a semiconductor memory device according to first embodiment of the present invention. The semiconductor memory device denoted by 10 has four memory array banks 1A to 1D provided in the form of a memory chip which are switched from one to another for storage operation. Each of the memory array banks 1A to 1D includes a plurality of memory arrays (only two shown in FIG. 1). Each memory array is connected by a data bus 2 to a DQ input/output circuit 4 for transmitting data between the memory array and the outside.

Also, DB clamp circuits 5 are provided across the data bus 2 between the memory array banks 1A to ID and the DQ circuit 4 for attenuating the effect of coupling noises caused by the parasitic capacitance in their adjacent lines of the data bus 2, as will be explained later in more detail.

In an operation of the semiconductor memory device 10, information data EXTDQ received from the outside are transmitted via an input (not shown) of the DQ input/output circuit 4, sent to corresponding memory arrays, determined by address data EXRA received with the information data EXTDQ, in the memory array banks 1A to 1D through the data bus 2 and the DB clamp circuits 5, and written onto the memory cells. Any of the information data written on the memory cells can be read out in response to input of data for reading, transmitted via the data bus 2 and DB clamp circuits 5 to the output of the DQ input/output circuit 4, and output to outside.

Figure 2:
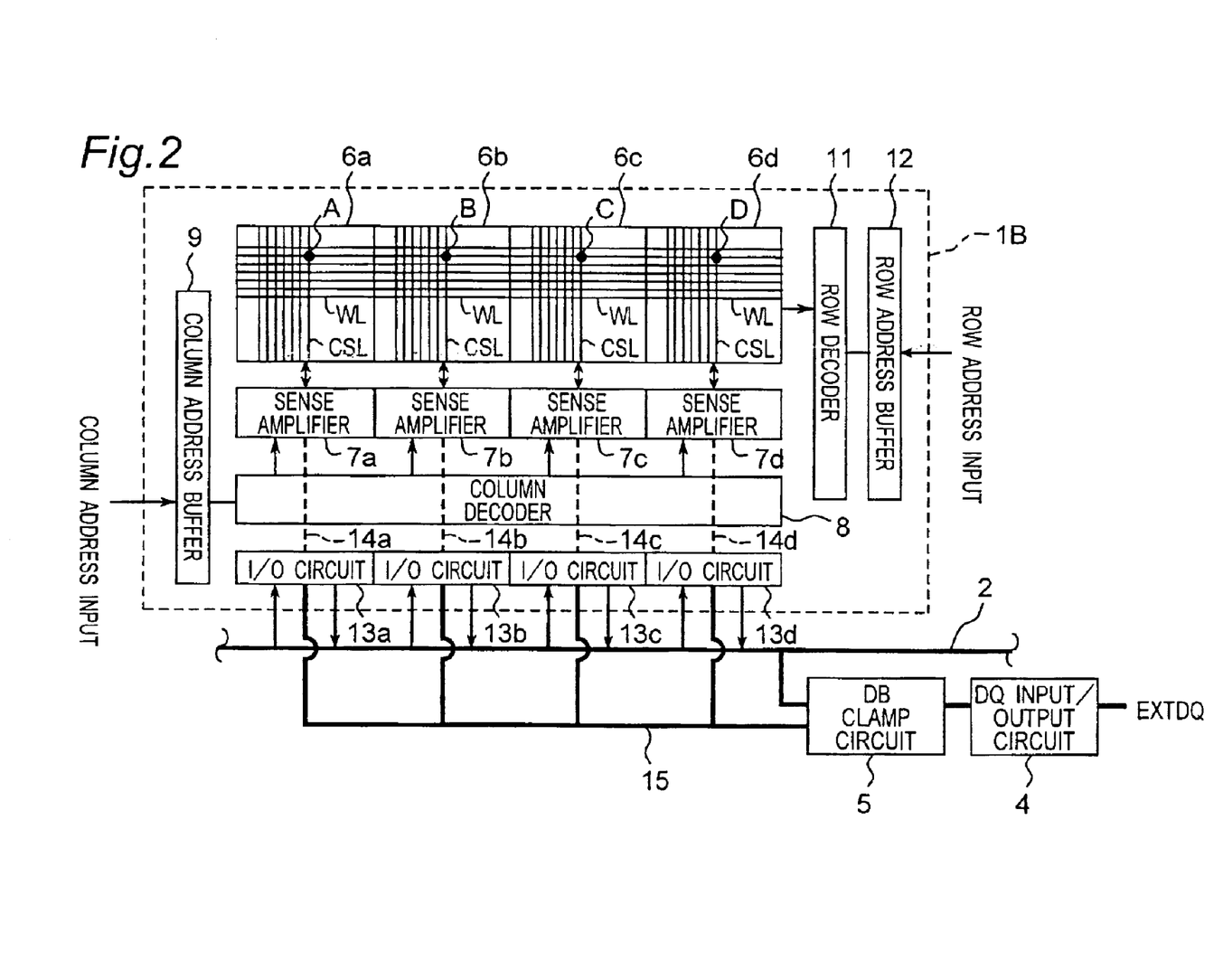
FIG. 2 is a diagram showing a part of a memory array bank provided in the semiconductor memory device.

FIG. 2 is a schematic diagram showing a detail of the memory array bank 1B. The other memory array banks 1A, 1C, and 1D are identical in the construction to the memory array bank 1B. The memory array bank 1B includes four memory arrays 6a to 6d, four sense amplifiers 7a to 7d connected to the corresponding memory arrays 6a to 6d, and four I/O circuits 13a to 13d which all constitute a transmission path of the information data. Also, the memory array back 1B includes a column decoder 8, a column address buffer 9 connected to the column decoder 8, a row decoder 11, and a row address buffer 12 connected to the row decoder 11 which all constitute a transmission path of the address data. The sense amplifiers 7a to 7d are connected to the four I/O circuits 13a to 13d via four sub data buses 14a to 14d, respectively.

Figure 3:
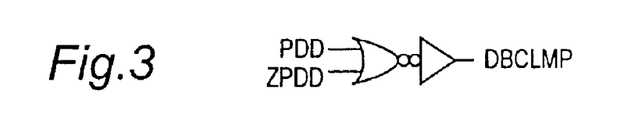
FIG. 3 is a diagram showing a control circuit for a DB clamp circuit provided in the I/O circuit.

As described above, particularly in the semiconductor memory device 10, the DB clamp circuits 5 are provided across the data bus 2 which connects between the memory array banks 1A to 1D and the DQ input/output circuit 4. The DB clamp circuits 5 provide "leak paths" from the lines of the data bus 2 to the ground GND. As shown in FIG. 2, the I/O circuits 13a to 13d corresponding to their respective memory arrays 6a to 6d are connected by a drive bus 15 to the DB clamp circuit 5. The on/off action of the DB clamp circuit 5 can be controlled by DB drive circuits provided in the I/O circuits 13a to 13d. For this purpose, each the DB drive circuit includes a specific control circuit for controlling the operation of the DB clamp circuit 5, shown in FIG. 3, in addition to the conventional arrangement described previously referring to FIG. 11.

Figure 4:
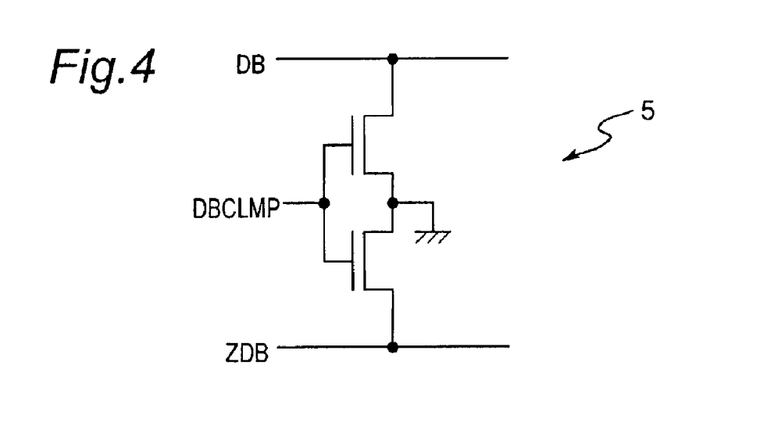
FIG. 4 is a diagram of the DB clamp circuit.

FIG. 4 illustrates a structure of the DB clamp circuit 5. The DB clamp circuit 5 allows the line of the data bus 2 to be connected to the ground by an N-channel transistor of which the gate width (W) is smaller than a predetermined value, thus providing a leak path to the ground GND. More specifically, the N-channel transistor is connected between a pair of lines DB and ZDB which is a basic unit of the data bus 2. The gate of the N-channel transistor is communicated to the drive bus 15 from the I/O circuits 13a to 13d and the source of it is communicated to the ground. The DB clamp circuit 5 in first embodiment is switched on in response to a pulse signal received at the gate of the N-channel transistor via the drive bus 15 and held throughout the period for data reading operation in the multi-bit test mode.

With the DB clamp circuits 5, in the multi-bit test mode, by grounding adjacent lines of data bus 2 are simultaneously used, a level of lines on "L(Hi-Z)" side, which may possibly be elevated by coupling noises of their parasitic capacitance C between their lines, can be reduced to such a level that can hardly be misjudged as an "H" level. Accordingly, fault judgment in the multi-bit test which may result from the coupling noise between adjacent lines of the data bus 2 will successfully be eliminated.

Second Embodiment

As described above, by providing the N-channel transistors between any two relevant lines of the data bus 2, the level of lines on "L(Hi-Z)" side can be reduced. At the time, on "H" side, a through current can flow from the drain to the ground GND via the lines of the data bus 2. Accordingly, the multi-bit test may be interrupted by the through current, depending on the gate length (L) and width (W) of the N-channel transistors. For eliminating this drawback, in second embodiment, the DB clamp circuits having a modified arrangement as follows is provided.

Figure 5:
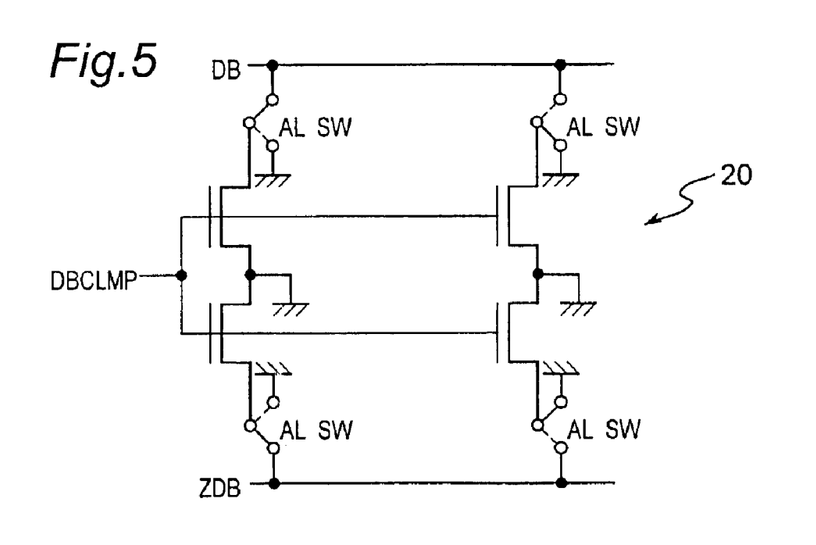
FIG. 5 is a diagram of another DB clamp circuit according to second embodiment of the present invention.

FIG. 5 illustrates the modified DB clamp circuit according to second embodiment. The modified DB clamp circuit 20 has two or more N-channel transistors provided in parallel between adjacent lines of the data bus 2 (only two shown in FIG. 5). Also, a switch (denoted by "AL SW") is provided between the drain of each N-channel transistor and the line DB or ZDB.

The DB clamp circuit 20 allows the operation mode of the N-channel transistors to be switched from one to another by the switch. Accordingly, the gate length (L) and width (W) of the N-channel transistor in the DB clamp circuit 20 can properly be modified, thus optimizing the size of the leak path to the ground GND. This inhibit the through current from the drain to the ground GND on "H" side from interrupting the result of the multi-bit test.

With the DB clamp circuit 20, the gate length and width of its N-channel transistors may be modified for each arrangement of DB clamp circuits 20 in the semiconductor memory device. For example, in the semiconductor memory device as shown in FIG. 1, provided that the three DB clamp circuits 5 with a single N-channel transistor are replaced by the DB clamp circuits 20 with two or more N-channel transistors, the gate length and width can be controlled for each DB clamp circuits located at a specific position. By optimizing the size for gate length and width at each position, the multi-bit test will be improved in the reliability.

Figure 6:
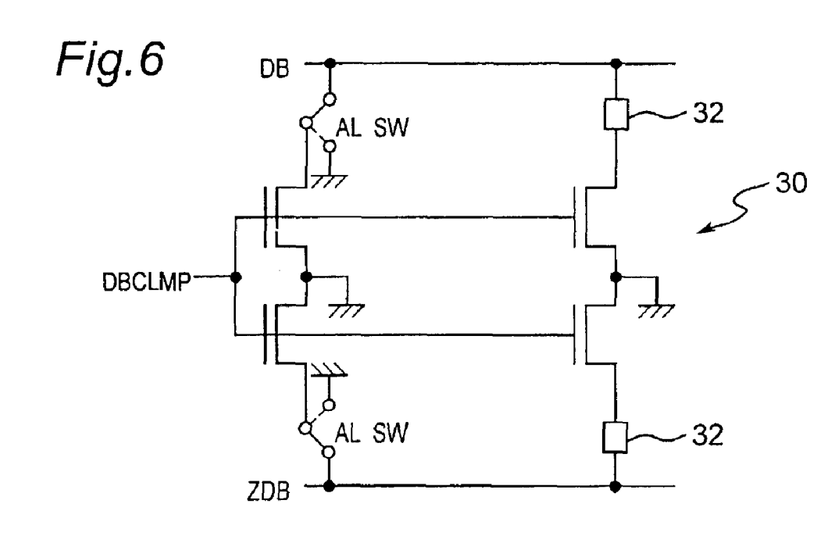
FIG. 6 illustrates a first modification of the DB clamp circuit of second embodiment.
Figure 7:
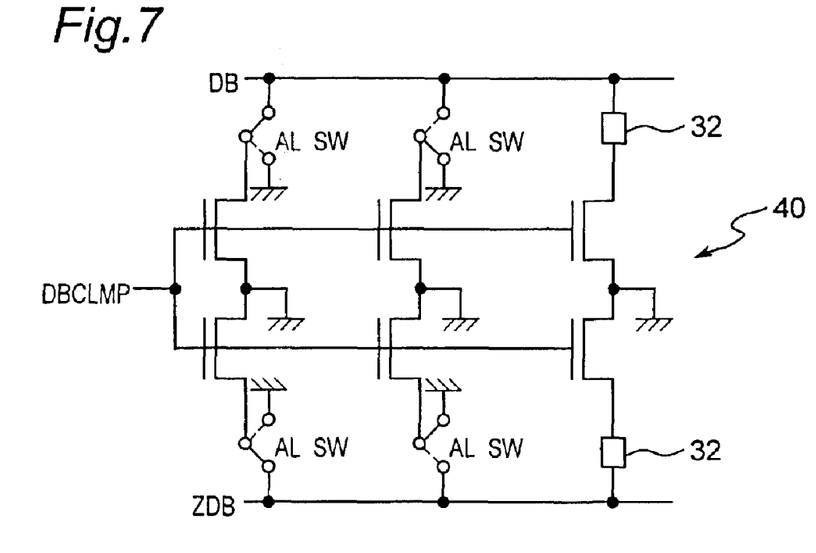
FIG. 7 illustrates a second modification of the DB clamp circuit of second embodiment.

In second embodiment, the switch with N-channel transistors is provided, but is not limited to the switch. For example, fuses 32 may be used as shown in a DB clamp circuit 30 of FIG. 6, which are disconnected when an over-current flows through. Alternatively, a combination of the N-channel transistor with switches and the N-channel transistor with fuses 32 may be used in a DB clamp circuit 40 as shown in FIG. 7.

Third Embodiment

Figure 8:
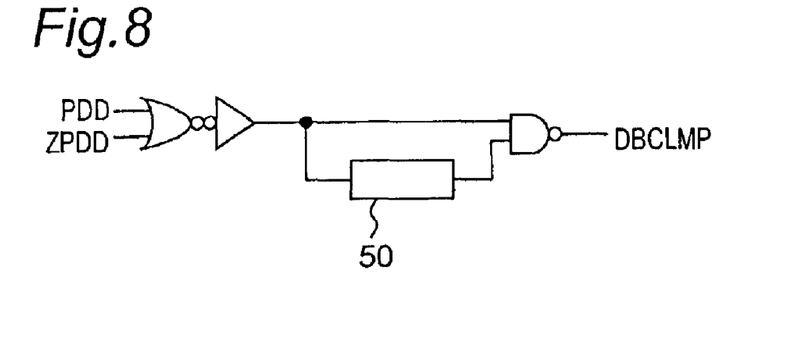
FIG. 8 is a diagram of a delay circuit provided in the I/O circuit for making the activation period of the DB clamp circuit variable according to third embodiment of the present invention.

FIG. 8 illustrates a delay circuit provided in each of the I/O circuits 13a to 13d for making the activation period of the DB clamp circuit variable, according to third embodiment of the present invention. The delay circuit denoted by 50 delays by a few nanoseconds the output of a pulse signal to the drive bus 15 shown in FIG. 2 from the start of energizing the line DB of the data bus 2, that is, from the leading edge of a PDD (i.e. data bus drive signal) in the DB drive circuit (See FIG. 12) incorporated in each of the I/O circuits 13a to 13d.

As a result, the input of the pulse signal to the gate of the N-channel transistor in the DB clamp circuit is delayed, i.e. the timing of turning the N-channel transistor on is delayed by a few nanoseconds from the start of energizing the line DB of the data bus 2. This causes the time required for increasing the line DB driven on "H" side to a CMOS level to be shorter than that of first embodiment (where the N-channel transistor is kept on throughout the period of data reading process in the multi-bit test). Accordingly, the multi-bit test can be prevented from declining in the frequency characteristic.

Fourth Embodiment

Figure 9:
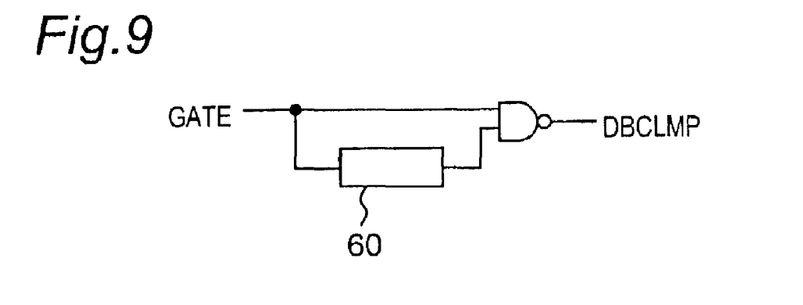
FIG. 9 is a diagram of a delay circuit provided in the output side of a DQ input/output circuit for making the activation period of the DB clamp circuit variable according to fourth embodiment of the present invention.

FIG. 9 illustrates a delay circuit provided in the output side of the DQ input/output circuit for making the activation period of the DB clamp circuit variable in fourth embodiment of the present invention. The arrangement of the output side of the DQ input/output circuit in fourth embodiment is identical to that shown in FIG. 13 except the delay circuit denoted by 60. The delay circuit 60 delays by a few nanoseconds the output of a pulse signal to the gate of the N-channel transistor in the DB clamp circuit from the time when the line DB driven on H side in the output of the DQ input/output circuit reaches to a CMOS level, that is, from the leading edge of a GATE signal shown in FIG. 13.

As a result, the timing of turning the N-channel transistor on is delayed by a few nanoseconds from the rise of the GATE signal in the output side of the DQ input/output circuit. This causes the time required for increasing the line DB driven on "H" side to a CMOS level to be shorter than that of first embodiment (where the N-channel transistor is kept on throughout the period of data reading process in the multi-bit test), as well as third embodiment. Accordingly, the multi-bit test can be prevented from declining in the frequency characteristic.

Although not shown, each DB clamp circuit provided in the semiconductor memory device may include a delay circuit for making the activation period of the DB clamp circuit of third embodiment or 4 so that the turn-on period of the N-channel transistor in the DB clamp circuit can be modified for each DB clamp circuit located at a specific position. This allows a level of line driven on "L(Hi-Z)" side and the time required for increasing the level of lines driven on "H" side to the CMOS level to be precisely controlled. As a result, the multi-bit test can further be improved in the reliability.

It would be understood that the present invention is not limited to the foregoing embodiments but various changes and modifications may be made without departing the scope of the present invention.

What is claimed is:

1. A semiconductor memory device of a bank switching type having a plurality of memory array banks provided in a memory chip which can be switched from one to another for storage operation, comprising:

a plurality of memory arrays incorporated in the memory array banks;

an input/output circuit for transmitting information data between the memory arrays and the outside;

a data bus consisting mainly of adjacent lines for connecting between the memory arrays and the input/output circuit; and N-channel transistors provided across the data bus and connected at their drain to the corresponding lines of the data bus and at their source to the ground, wherein when a multi-bit test is commenced for writing and reading data on the memory arrays, the N-channel transistors are turned on to connect the lines of the data bus to the ground.

2. The semiconductor memory device according to claim 1, wherein while a set of the N-channel transistors are connected in parallel to each other across each line of the data bus, a switch is provided at the drain of each the N-channel transistor for connecting and disconnecting the line and the drain.

3. The semiconductor memory device according to claim 1, wherein while a set of the N-channel transistors are connected in parallel to each other across each line of the data bus, a fuse is provided at the drain of each the N-channel transistor for disconnecting the line when receiving an over-current.

4. The semiconductor memory device according to claim 1, further comprising a delay circuit for delaying by a predetermined length of time the input of a signal to the gate of the N-channel transistor from the start of driving the data via the lines of the data bus.

5. The semiconductor memory device according to claim 1, further comprising a delay circuit for delaying by a predetermined length of time the input of a signal to the gate of the N-channel transistor when the output side of the input/output circuit on the lines has reached to a CMOS level.

* * * * *